(12) United States Patent
Hashimoto et al.

(10) Patent No.: US 8,415,180 B2
(45) Date of Patent: Apr. 9, 2013

(54) METHOD FOR FABRICATING WAFER PRODUCT AND METHOD FOR FABRICATING GALLIUM NITRIDE BASED SEMICONDUCTOR OPTICAL DEVICE

(75) Inventors: Shin Hashimoto, Itami (JP); Katsushi Akita, Itami (JP); Kensaku Motoki, Itami (JP); Shinsuke Fujiwara, Itami (JP); Hideaki Nakahata, Itami (JP)

(73) Assignees: Sumitomo Electric Industries, Ltd., Osaka-shi (JP); Koha Co., Ltd., Tokyo (JP)

( * ) Notice: Subject to any disclaimer, the term of this patent is extended or adjusted under 35 U.S.C. 154(b) by 0 days.

(21) Appl. No.: 13/318,039
(22) PCT Filed: Mar. 1, 2010
(86) PCT No.: PCT/JP2010/053260
§ 371 (c)(1),
(2), (4) Date: Dec. 1, 2011
(87) PCT Pub. No.: WO2010/125850
PCT Pub. Date: Nov. 4, 2010

(65) Prior Publication Data
US 2012/0070929 A1 Mar. 22, 2012

(30) Foreign Application Priority Data
Apr. 30, 2009 (JP) .............................. P2009-111197

(51) Int. Cl.
*H01L 21/00* (2006.01)
(52) U.S. Cl. .............. 438/22; 257/E21.09; 257/E21.11; 257/E21.17; 257/E21.211; 257/E21.155; 257/E21.157; 438/46; 438/47; 438/478; 438/604; 438/607; 438/681
(58) Field of Classification Search ............. 257/E21.09, 257/E21.11, E21.17, E21.121, E21.155, E21.157; 438/22, 46, 47, 478, 607, 681
See application file for complete search history.

(56) References Cited

U.S. PATENT DOCUMENTS 6,350,666 B2 * 2/2002 Kryliouk ....................... 438/604
2006/0246614 A1 * 11/2006 Suh ................................. 438/22
(Continued)

FOREIGN PATENT DOCUMENTS

| JP | 2003-077853 A2 | 3/2003 |
| JP | 2006-032739 A2 | 2/2006 |
| JP | 2007-134463 A2 | 5/2007 |
| JP | 2008-053608 A2 | 3/2008 |

OTHER PUBLICATIONS

Shimamura et al., "Epitaxial Growth of GaN on (1 0 0) β-$Ga_2O_3$ Substrates by Metalorganic Vapor Phase Epitaxy," Japanese Journal of Applied Physics, vol. 44, No. 1, pp. L7-L8 (2005).
(Continued)

*Primary Examiner* — Asok K Sarkar
(74) *Attorney, Agent, or Firm* — Venable LLP; Michael A. Sartori; Tamatane J. Aga

(57) ABSTRACT

Provided is a method for fabricating a wafer product including an active layer grown on a gallium oxide substrate and allowing an improvement in emission intensity. In step S105, a buffer layer 13 comprised of a Group III nitride such as GaN, AlGaN, or AlN is grown at 600 Celsius degrees on a primary surface 11a of a gallium oxide substrate 11. After the growth of the buffer layer 13, while supplying a gas G2, which contains hydrogen and nitrogen, into a growth reactor 10, the gallium oxide substrate 11 and the buffer layer 13 are exposed to an atmosphere in the growth reactor 11 at 1050 Celsius degrees. A Group III nitride semiconductor layer 15 is grown on the modified buffer layer. The modified buffer layer includes, for example, voids. The Group III nitride semiconductor layer 15 can be comprised of GaN and AlGaN. When the Group III nitride semiconductor layer 15 is formed of these materials, excellent crystal quality is obtained on the modified buffer layer 14.

24 Claims, 15 Drawing Sheets

U.S. PATENT DOCUMENTS

2007/0131951 A1* 6/2007 Ikemoto et al. .............. 257/94
2007/0134833 A1* 6/2007 Ikemoto et al. .............. 438/33
2008/0073657 A1 3/2008 Liang et al.
2010/0270548 A1* 10/2010 Ikemoto et al. .............. 257/43
2012/0003770 A1* 1/2012 Hashimoto et al. ........... 438/46

OTHER PUBLICATIONS

Yamada et al., "InGaN-Based Near-Ultraviolet and Blue-Light-Emitting Diodes with High External Quantum Efficiency Using a Patterned Sapphire Substrate and a Mesh Electrode," Japanese Journal of Applied Physics, vol. 41, Part 2, No. 12B, pp. L1431-L1433 (Dec. 15, 2002).

Shchekin et al., "High Performance Thin-Film Flip-Chip InGaN-GaN Light-Emitting Diodes," Applied Physics Letters, 89, pp. 071109-1-071109-3 (2006).

* cited by examiner

Fig.2
(a)
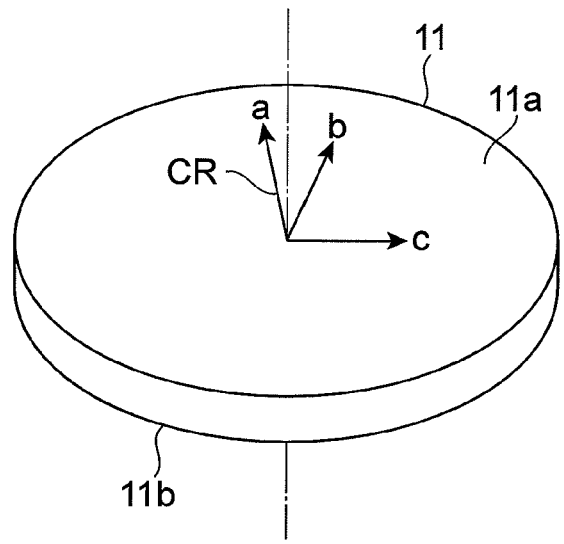
(b)
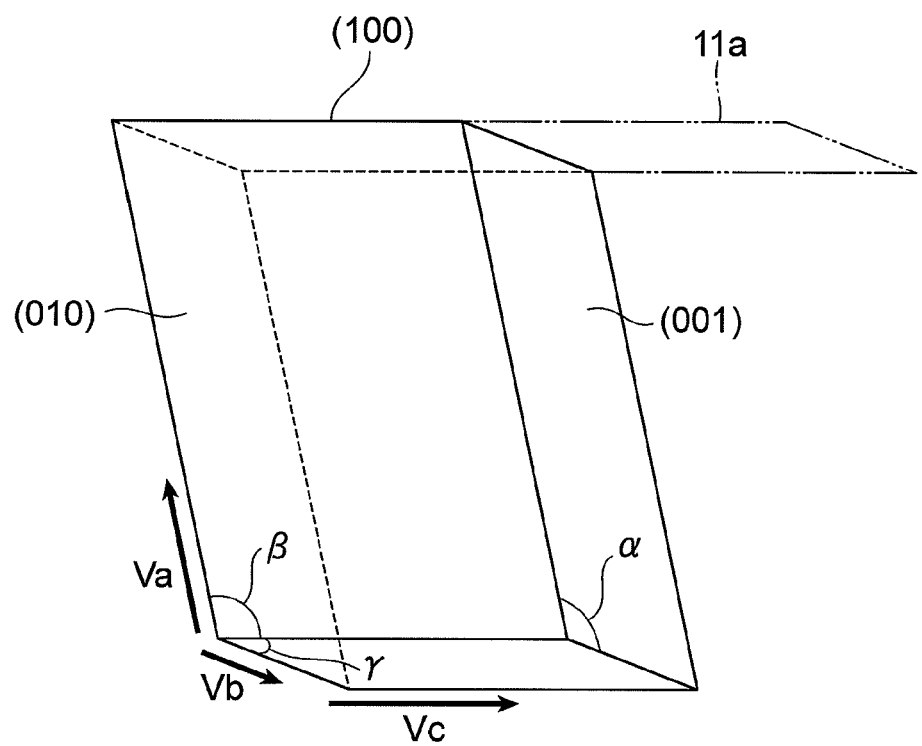

Fig.3
(a)
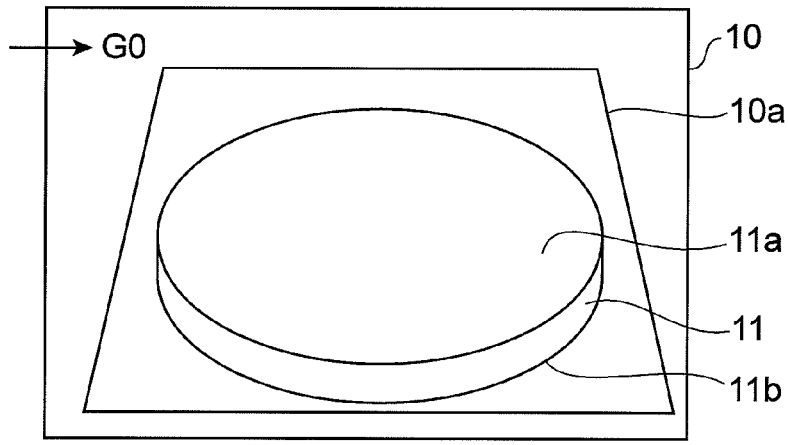
(b)
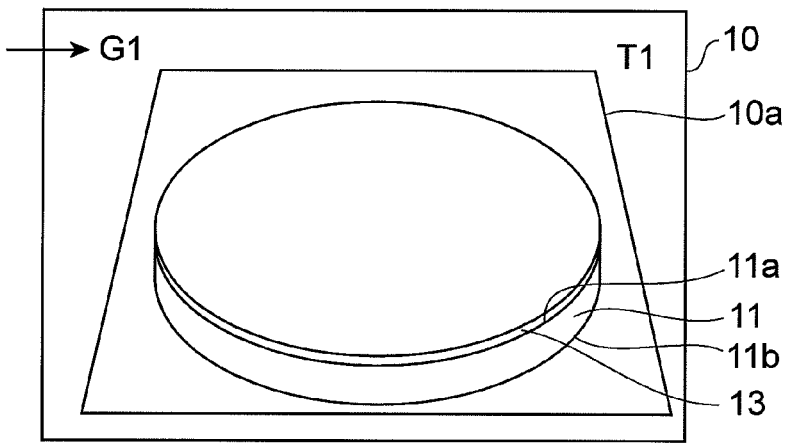
(c)
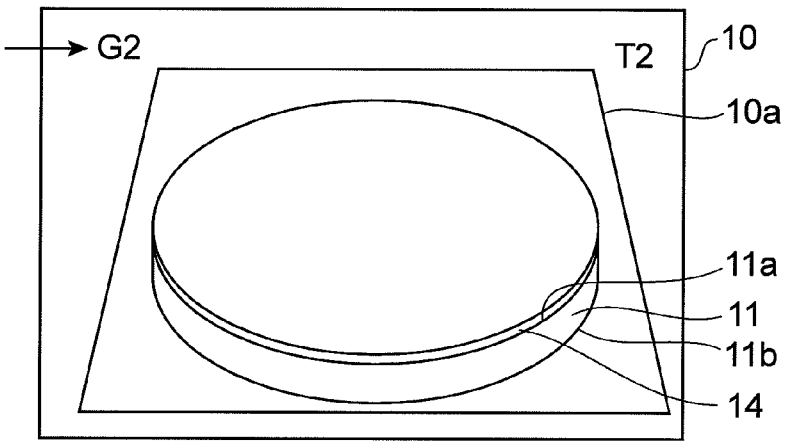

Fig.4
(a)
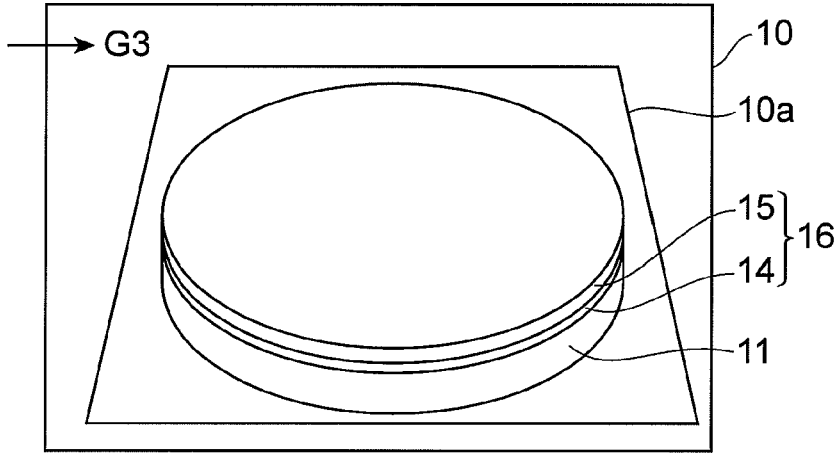
(b)
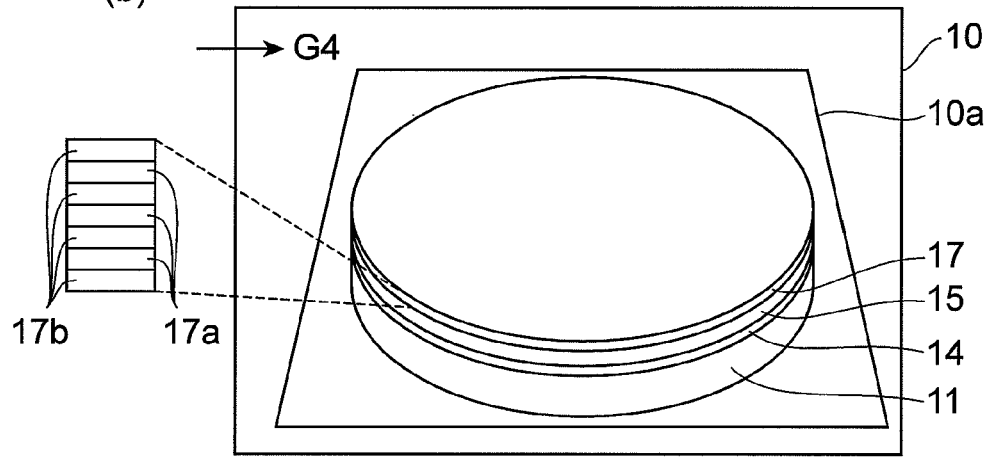
(c)
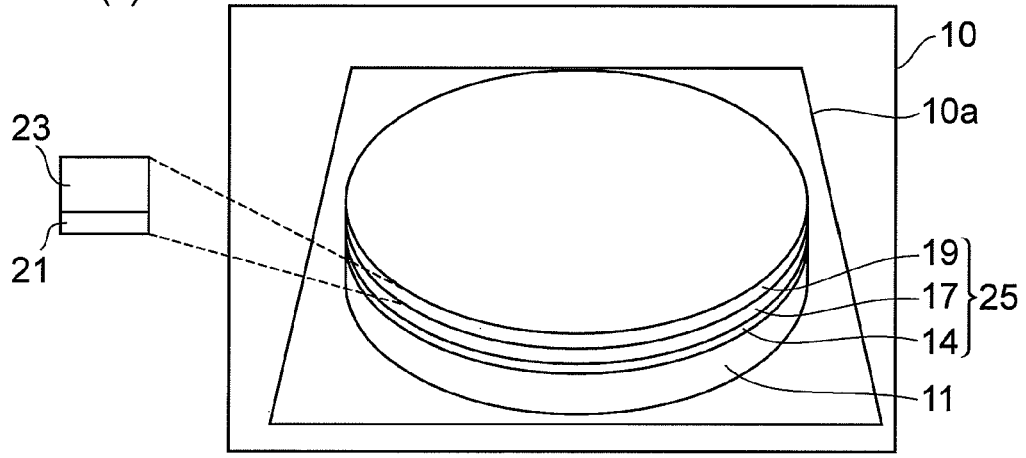

Fig.5
(a)
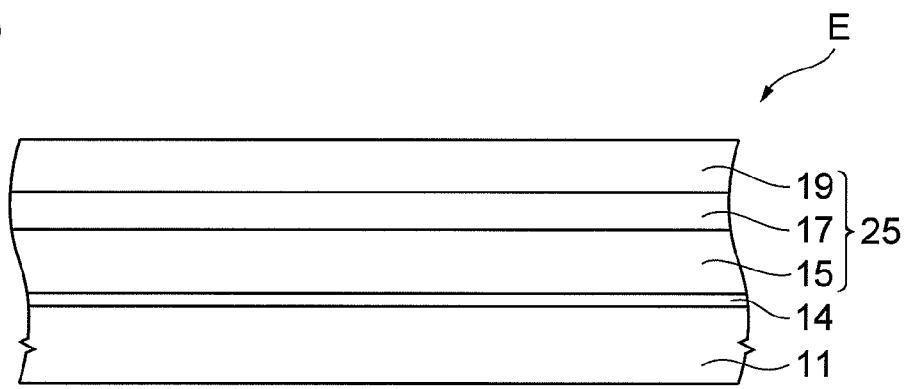
(b)
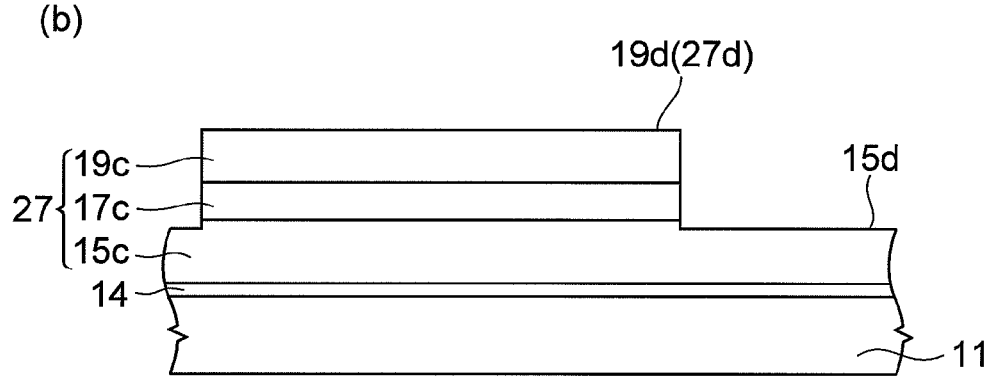
(c)
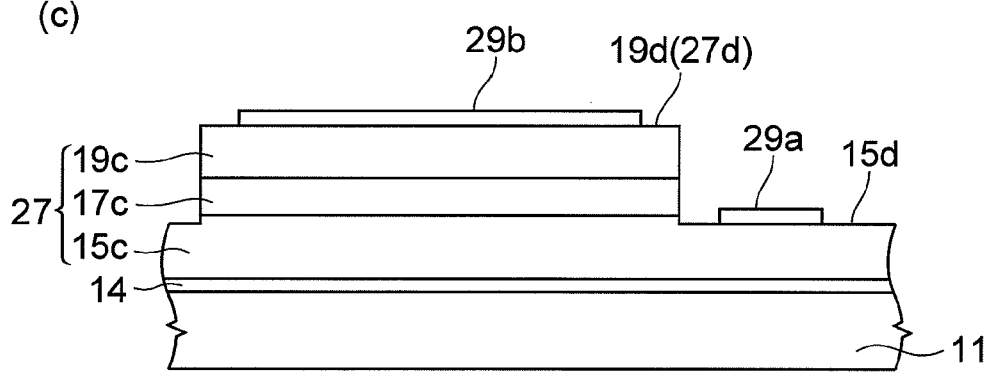

Fig. 11

| No. | Fabricating method of underlying n-GaN | Epi-layer / substrate interface | Emission intensity (A.U.) |
|---|---|---|---|
| EW 0 | n-GaN on sapphire substrate | w/o voids or others | 1.0 |
| EW 1 | Experimental Example 1 | w/o voids or others | 1.2 |
| EW 2 | Experimental Example 2 | with voids of about 100 nm | 1.3 |
| EW 3 | Experimental Example 3 | with voids of up to about 1 μm | 1.5 |
| EW 4 | Experimental Example 4 | with transition layer | 1.4 |

Fig.15

| No. | Fabricating method of underlying n-GaN | Epi-layer / substrate interface | Time for peeling (relative comparison) |
|---|---|---|---|
| LED 0 | n-GaN on sapphire substrate | w/o voids or others | 1.00 |
| LED 1 | Experimental Example 1 | w/o voids or others | 0.36 |
| LED 2 | Experimental Example 2 | with voids of about 100 nm | 0.28 |
| LED 3 | Experimental Example 3 | with voids of up to about 1 μm | 0.17 |
| LED 4 | Experimental Example 4 | with transition layer | 0.08 |

METHOD FOR FABRICATING WAFER PRODUCT AND METHOD FOR FABRICATING GALLIUM NITRIDE BASED SEMICONDUCTOR OPTICAL DEVICE

TECHNICAL FIELD

The present invention relates to a method for fabricating a wafer product and a method for fabricating a gallium nitride based semiconductor optical device.

BACKGROUND ART

Non Patent Literature 1 discloses epitaxial growth of GaN on a (100) β-$Ga_2O_3$ substrate by the metal-organic vapor phase epitaxy process. In the epitaxial growth of GaN, a low-temperature GaN buffer layer is grown at 600 Celsius degrees on the $Ga_2O_3$ substrate. A GaN layer of 1000 nm is grown at 1070 Celsius degrees directly on this low-temperature GaN buffer layer.

Non Patent Literature 2 discloses an InGaN light emitting diode. The light emitting diode uses a patterned sapphire substrate and plural gallium nitride based semiconductor layers are grown through a buffer layer on this sapphire substrate. The pattern formation of the sapphire substrate can improve extraction efficiency of light.

Non Patent Literature 3 discloses an InGaN—GaN light emitting diode. This light emitting diode includes a GaN-based film grown on a sapphire substrate. The sapphire substrate is separated from the GaN-based film, using a laser beam.

CITATION LIST

Non Patent Literatures

Non Patent Literature 1: Jpn. J. Appl. Phys. Vol. 44. No. 1, 2005, pp L7-L5
Non Patent Literature 2: Jpn. J. Appl. Phys. Vol. 41, (2002), pp L1431-L1433, Part 2, No. 12B, 15, December, 2002
Non Patent Literature 3: Appl. Phys. Lett. Vol. 89, 071109, (2006)

SUMMARY OF INVENTION

Technical Problem

The gallium oxide substrate is applicable to fabrication of gallium nitride based semiconductor optical devices. According to inventor's knowledge, gallium oxide is affected by a hydrogen-containing atmosphere used in growth of gallium nitride based semiconductor layers. In order to avoid the damage to the gallium oxide substrate due to hydrogen, a film formation sequence to be used is to keep the gallium oxide substrate from touching a high-temperature hydrogen atmosphere. It is, however, discovered by inventors' investigation that a low-temperature buffer layer in contact with gallium oxide could be modified in the sequence of growing the gallium nitride based semiconductor layers for gallium nitride based semiconductor optical devices on the gallium oxide substrate.

The present invention has been accomplished in view of the above-described circumstances, and it is an object of the present invention to provide a method for fabricating a wafer product including an active layer grown on a gallium oxide substrate, to allow an improvement in emission intensity, and it is another object of the present invention to provide a method for fabricating a gallium nitride based semiconductor optical device including an active layer grown on a gallium oxide substrate, to allow an improvement in emission intensity.

Solution to Problem

One aspect of the present invention is a method for fabricating a wafer product for a gallium nitride based semiconductor optical device. This method comprises the steps of: (a) preparing a gallium oxide substrate; (b) forming a laminate body on a primary surface of the gallium oxide substrate, the laminate body comprising Group III nitrides; (c) forming an active layer, after forming the laminate body; and (d) growing a second Group III nitride semiconductor layer on the active layer. The step of forming the laminate body comprises: (b1) placing the gallium oxide substrate in a growth reactor and thereafter growing a Group III nitride buffer layer at a first temperature on the primary surface of the gallium oxide substrate; (b2) changing a substrate temperature from the first temperature to a second temperature higher than the first temperature, after growing the Group III nitride buffer layer; (b3) exposing the gallium oxide substrate and the Group III nitride buffer layer to an atmosphere in the growth reactor at the substrate temperature of the second temperature, while supplying hydrogen and nitrogen into the growth reactor; and (b4) growing a Group III nitride semiconductor layer for the gallium nitride based semiconductor optical device by a metal-organic vapor phase epitaxy method, after exposing the gallium oxide substrate and the Group III nitride buffer layer to the atmosphere in the growth reactor. The Group III nitride semiconductor layer has a first conductivity type, and the gallium nitride based semiconductor layer has a second conductivity type. A thickness of the Group III nitride buffer layer is smaller than a thickness of the Group III nitride semiconductor layer.

According to this method, after the substrate temperature is changed from the first temperature for the growth of the Group III nitride buffer layer to the second temperature, the gallium oxide substrate and the Group III nitride buffer layer are exposed to the atmosphere containing hydrogen and nitrogen. Prior to the growth of the Group III nitride semiconductor layer, the Group III nitride buffer layer is modified in the hydrogen-containing atmosphere, and the Group III nitride semiconductor is grown on the modified Group III nitride buffer layer. The active layer is provided on the Group III nitride semiconductor layer grown after the modification. For this reason, an improvement is made in the light extraction efficiency of light from the gallium nitride based semiconductor optical device having the modified Group III nitride buffer layer. The thickness of the Group III nitride buffer layer is smaller than the thickness of the Group III nitride semiconductor layer, and thus the modification due to the atmosphere containing hydrogen and nitrogen is induced near the surface of the gallium oxide substrate.

In the method according to the first aspect of the present invention, during the exposure of the gallium oxide substrate and the Group III nitride buffer layer to the atmosphere in the growth reactor, a preferred configuration is such that a flow rate of hydrogen is not less than a flow rate of nitrogen and that the second temperature is not less than 950 Celsius degrees, preferably around 1050 Celsius degrees. When the atmosphere contains hydrogen and the substrate temperature is not less than 950 Celsius degrees, more preferably around 1050 Celsius degrees, the Group III nitride buffer layer is modified prior to the growth of the Group III nitride semiconductor layer, and the Group III nitride semiconductor is grown on the modified Group III nitride buffer layer. In the method according to the aspect of the present invention, the flow rate of hydrogen is preferably not less than the flow rate of nitrogen during the exposure of the gallium oxide substrate and the Group III nitride buffer layer to the atmosphere in the growth reactor. In this case, excellent modification is implemented.

In the method according to the aspect of the present invention, the period of time in the step of exposing to the atmosphere can be not less than 10 seconds. When this period is not less than 10 seconds, more preferably not less than one minute, the aforementioned modification can be effectively induced.

In the method according to the first aspect of the present invention, the thickness of the Group III nitride buffer layer can be not less than 2 nanometers. When the thickness of the buffer layer is not less than 2 nanometers, more preferably 10 nanometers, the crystal quality of the Group III nitride semiconductor layer is good. In the method according to the first aspect of the present invention, the thickness of the Group III nitride buffer layer can be not more than 100 nanometers. When the thickness of the buffer layer is not more than 100 nanometers, the crystal quality of the Group III nitride semiconductor layer is made excellent.

In the method according to the one aspect of the present invention, the Group III nitride buffer layer can include at least one of a GaN layer, an AlGaN layer, and an AlN layer. When the buffer layer is formed of these materials, technical contribution by the modification is obtained.

In the method according to the aspect of the present invention, the Group III nitride buffer layer can include a GaN layer. When the buffer layer includes the GaN layer, modification is induced by reaction between GaN and hydrogen to make technical contribution by the modification.

In the method according to the aspect of the present invention, the Group III nitride semiconductor layer can be comprised of GaN and AlGaN. When the Group III nitride semiconductor layer is made of these materials, technical contribution from the modification is obtained.

In the method according to the aspect of the present invention, the primary surface of the gallium oxide substrate can be a (100) plane. When a crystal plane of the primary surface of the gallium oxide substrate is substantially a (100) plane, a c-plane or a plane slightly inclined from the c-plane is provided in the surface of the Group III nitride semiconductor layer.

In the method according to the aspect of the present invention, the laminate body can include a plurality of voids formed at an interface between the gallium oxide substrate and the laminate body. According to this method, these voids are formed at the interface by the modification process.

In the method according to the aspect of the present invention, the laminate body includes a transition layer, which is formed at an interface between the gallium oxide substrate and the laminate body, and the transition layer covers the primary surface of the gallium oxide substrate. According to this method, the transition layer is formed at the interface by the modification process. The transition layer can include a Group III nitride region.

Another aspect of the present invention relates to a method for fabricating a gallium nitride based semiconductor optical device. This method comprises the steps of: (a) preparing a gallium oxide substrate; and (b) forming a laminate body on a primary surface of the gallium oxide substrate, the laminate body comprising Group III nitrides. The step of forming the laminate body includes (b1) after placing the gallium oxide substrate in a growth reactor, growing a Group III nitride buffer layer at a first temperature on the primary surface of the gallium oxide substrate; (b2) changing a substrate temperature from the first temperature to a second temperature higher than the first temperature, after growing the Group III nitride buffer layer; (b3) exposing the gallium oxide substrate and the Group III nitride buffer layer to an atmosphere in the growth reactor at the substrate temperature of the second temperature, while supplying hydrogen and nitrogen into the growth reactor; and (b4) growing a first Group III nitride semiconductor layer for the gallium nitride based semiconductor optical device by a metal-organic vapor phase epitaxy method, after exposing the gallium oxide substrate and the Group III nitride buffer layer to the atmosphere in the growth reactor. The Group III nitride semiconductor layer has a first conductivity type, and the gallium nitride based semiconductor layer has a second conductivity type. A thickness of the Group III nitride buffer layer is smaller than a thickness of the first Group III nitride semiconductor layer.

According to this method, after the substrate temperature is changed from the first temperature for the growth of the Group III nitride buffer layer to the second temperature, the gallium oxide substrate and the Group III nitride buffer layer are exposed to the atmosphere containing hydrogen and nitrogen. When the atmosphere contains hydrogen, the Group III nitride buffer layer is modified prior to the growth of the Group III nitride semiconductor layer and the Group III nitride semiconductor is grown on the modified Group III nitride buffer layer. This improves the light extraction efficiency of light in the gallium nitride based semiconductor optical device provided with the active layer on the modified Group III nitride buffer layer. The thickness of the Group III nitride buffer layer is smaller than the thickness of the Group III nitride semiconductor layer and thus the modification by the atmosphere containing hydrogen and nitrogen is created near the surface of the gallium oxide substrate.

In the method according to the other aspect of the present invention, during exposing the gallium oxide substrate and the Group III nitride buffer layer to the atmosphere in the growth reactor, the atmosphere contains hydrogen and a preferred configuration is such that a flow rate of hydrogen is not less than a flow rate of nitrogen and the second temperature is not less than 950 Celsius degrees, more preferably around 1050 Celsius degrees. When the atmosphere contains hydrogen and, more preferably, when the flow rate of hydrogen is not less than the flow rate of nitrogen and the substrate temperature is not less than 950 Celsius degrees, more preferably around 1050 Celsius degrees, the Group III nitride buffer layer is modified before the growth of the Group III nitride semiconductor layer.

In the method according to the second aspect of the present invention, a time in the step of exposing to the atmosphere can be not less than 10 seconds. When this time is not less than 10 seconds, more preferably not less than one minute, the aforementioned modification can be efficiently induced.

In the method according to the other aspect of the present invention, the thickness of the Group III nitride buffer layer can be not less than 2 nanometers. When the thickness of the buffer layer is not less than 2 nanometers, more preferably 10 nanometers, the crystal quality of the Group III nitride semiconductor layer is made excellent.

In the method according to the other aspect of the present invention, the Group III nitride buffer layer can include at least one of a GaN layer, an AlGaN layer, and an AlN layer. When the buffer layer is made of these materials, technical contribution from the modification is obtained. In the method according to the other aspect of the present invention, the Group III nitride buffer layer can include a GaN layer. When the buffer layer includes the GaN layer, modification is induced by reaction between GaN and hydrogen to provide technical contribution by the modification.

In the method according to the second aspect of the present invention, the Group III nitride semiconductor layer can comprise GaN and AlGaN. When the Group III nitride semiconductor layer is formed of these materials, technical contribution by the modification is obtained.

In the method according to the other aspect of the present invention, the primary surface of the gallium oxide substrate can be a (100) plane. A crystal plane of the primary surface of the gallium oxide substrate is substantially a (100) plane, and a c-plane or a plane slightly inclined from the c-plane is formed in a surface of the Group III nitride semiconductor layer.

In the method according to the other aspect of the present invention, the laminate body includes a modified layer located at an interface between the gallium oxide substrate and the laminate body, and the modified layer is provided by exposing the gallium oxide substrate and the Group III nitride buffer layer to an atmosphere containing hydrogen and nitrogen in the growth reactor.

In the method according to the other aspect of the present invention, the modified layer can include plural voids formed at an interface between the gallium oxide substrate and the laminate body. Alternatively, in the method according to the other aspect of the present invention, the modified layer has a transition layer covering the primary surface of the gallium oxide substrate.

In the method according to the other aspect of the present invention, the gallium oxide substrate, the Group III nitride semiconductor layer, the active layer, and the gallium nitride based semiconductor layer constitute a wafer product. This method can further comprise: forming a first electrode on the wafer product, the first electrode being formed to provide a potential to the Group III nitride semiconductor layer, and forming a second electrode on the wafer product, the second electrode is formed to the gallium nitride based semiconductor layer.

According to this method, carriers to be injected into the active layer comes from the first and second electrodes. The carriers migrate through the electro-conductive gallium oxide substrate to reach the active layer.

In the method according to the other aspect of the present invention, the thickness of the Group III nitride buffer layer can be not more than 100 nanometers. According to this method, when the thickness of the Group III nitride buffer layer is not more than 100 nanometers, it is feasible to reduce increase of resistance due to the buffer layer.

The method according to the other aspect of the present invention can further comprise: etching the active layer and the gallium nitride based semiconductor layer so as to expose the Group III nitride semiconductor layer; forming a first electrode on the wafer product, the first electrode being provided to form a potential to the Group III nitride semiconductor layer; and forming a second electrode on the wafer product, the second electrode being provided to form a potential to the gallium nitride based semiconductor layer.

This method provides a light emitting device with the first and second electrodes on one end face of the device.

The above objects and other objects, features, and advantages of the present invention will more readily become clear from the following detailed description of the preferred embodiments of the present invention with reference to the accompanying drawings.

Advantageous Effects of Invention

As described above, the one aspect of the present invention provides the method for fabricating a wafer product including an active layer grown on a gallium oxide substrate to allow the improvement in emission intensity. The another aspect of the present invention provides the method for fabricating a gallium nitride based semiconductor optical device including an active layer grown on a gallium oxide substrate to allows the improvement in emission intensity.

BRIEF DESCRIPTION OF DRAWINGS

FIG. 2 is a drawing showing a monoclinic gallium oxide wafer and the crystal lattice of monoclinic gallium oxide.

FIG. 3 is a drawing schematically showing major steps in the method for fabricating the wafer product and the method for fabricating the gallium nitride based semiconductor optical device according to the embodiment.

FIG. 4 is a drawing schematically showing major steps in the method for fabricating the wafer product and the method for fabricating the gallium nitride based semiconductor optical device according to the embodiment.

FIG. 5 is a drawing schematically showing major steps in the method for fabricating the wafer product and the method for fabricating the gallium nitride based semiconductor optical device according to the embodiment.

FIG. 11 is a drawing showing emission characteristics in Example 2.

FIG. 15 is a drawing showing relative values of time necessary for peeling.

DESCRIPTION OF EMBODIMENTS

The expertise of the present invention can be readily understood in view of the following detailed description with reference to the accompanying drawings presented by way of illustration. The below will describe embodiments of the method for fabricating the wafer product and the method for fabricating the gallium nitride based semiconductor optical device according to the present invention, with reference to the accompanying drawings. The same portions will be denoted by the same reference signs as much as possible.

Figure 1:
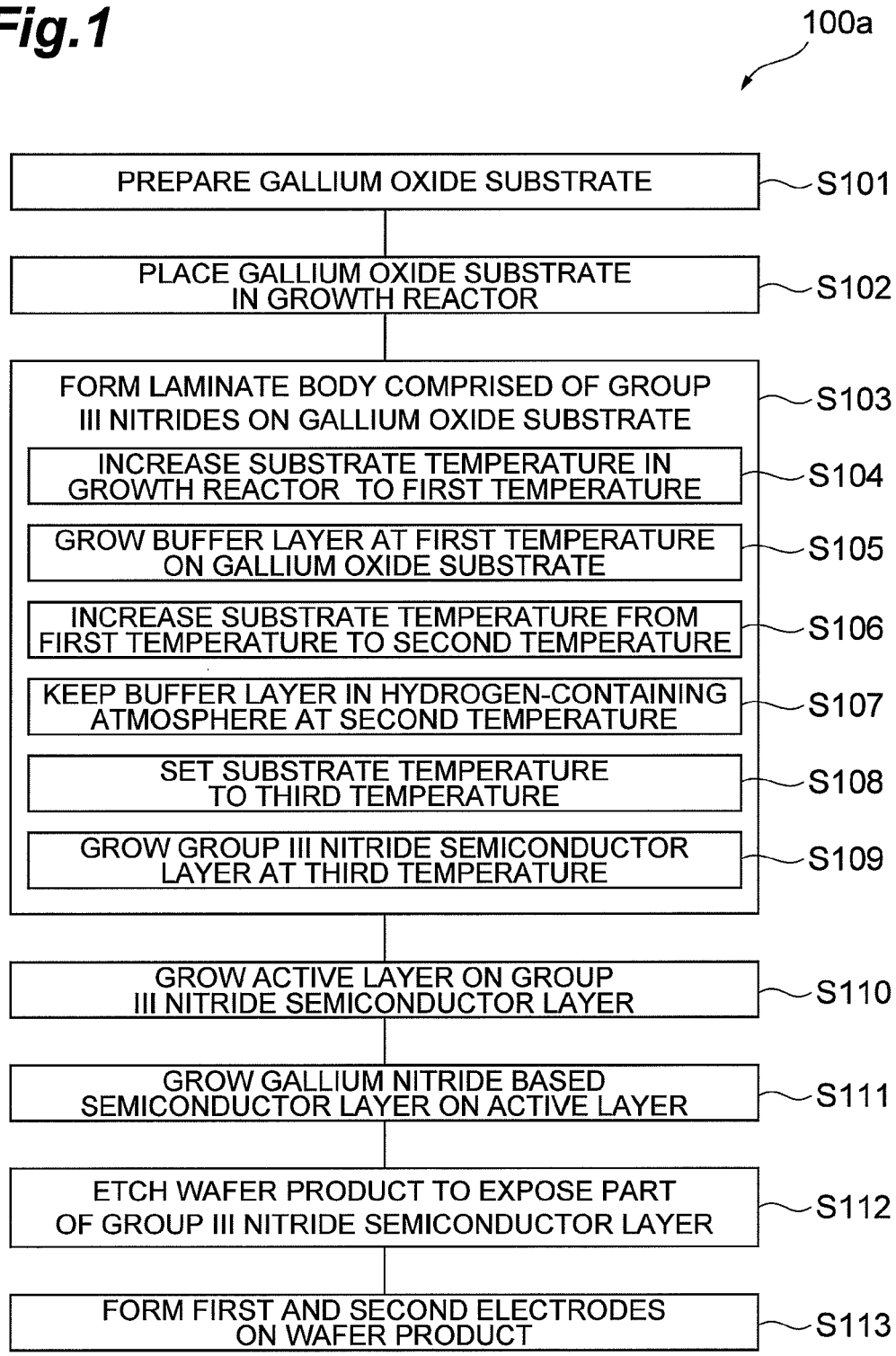
FIG. 1 is a drawing showing a major step flow in a method for fabricating a wafer product and a method for fabricating a gallium nitride based semiconductor optical device according to an embodiment of the present invention.

FIG. 1 is a drawing showing a flow with major steps in the method for fabricating the wafer product and the method for fabricating the gallium nitride based semiconductor optical device according to the present embodiment. In the step flow of these methods, a semiconductor optical device is fabricated as the gallium nitride based semiconductor optical device. In the step flow 100a, step S101 is to prepare a gallium oxide substrate 11 with a primary surface comprised of monoclinic gallium oxide. With reference to FIG. 2 (a), the gallium oxide substrate 11 is shown. This substrate 11 comprises, for example, a β-Ga$_2$O$_3$ single crystal. The substrate 11 includes a primary surface 11a and a back surface 11b, and the primary surface comprises monoclinic gallium oxide and, for example, the primary surface 11a and the back surface 11b are parallel to each other. The primary surface 11a of the substrate 11 is, for example, a (100) plane of monoclinic gallium oxide. This primary surface 11a can be inclined, for example, at an angle of not more than 1 degrees and not less than 0 degrees relative to the (100) plane. A crystal coordinate system CR is shown in FIG. 2 (a) and the crystal coordinate system CR has a-axis, b-axis, and c-axis.

With reference to FIG. 2 (b), a crystal lattice of monoclinic gallium oxide is shown. The lattice constants of the a-axis, b-axis, and c-axis of the crystal lattice of monoclinic gallium oxide are 1.223 nm, 0.304 nm, and 0.58 nm, respectively. Vectors Va, Vb, and Vc represent the directions of the a-axis, b-axis, and c-axis, respectively. The vectors Va and Vb define the (001) plane, vectors Vb, Vc the (100) plane, and the vectors Vc and Va the (010) plane. An angle α made by the vectors Va and Vb and an angle γ made by the vectors Vb and Vc are 90 degrees, and the angle β made by the vectors Vc and Va is 103.7 degrees. For indicating the inclination angle $A_{OFF}$ of the primary surface 11a of the substrate, the substrate primary surface 11a is indicated by a chain line in FIG. 2 (b). With this substrate 11, an epitaxial layer with an excellent morphology is grown on the substrate primary surface 11a of the (100) plane of monoclinic gallium oxide. When the crystal plane of the primary surface 11a of the gallium oxide substrate 11 is substantially the (100) plane, a surface of a Group III nitride semiconductor layer for gallium nitride based semiconductor optical device has a c-plane or a plane slightly inclined from the c-plane.

In step S102 shown in FIG. 1, the substrate 11 is placed on a susceptor 10a in a growth reactor 10, as shown in FIG. 3 (a). In step S103, in order to produce an epitaxial substrate, a laminate structure formed thereon and this laminate structure includes plural Group III nitride films. Growth of Group III nitride films is carried out, for example, by the metal-organic vapor phase epitaxy (MOVPE) process or the like.

After the substrate 11 is loaded on the susceptor in the growth reactor 10, in step S104, the susceptor temperature of the gallium oxide substrate 11 is changed in the growth reactor 10, while supplying a gas G0 into the growth reactor 10, as shown in FIG. 3 (b). The gas G0 can contain, for example, nitrogen gas. As long as the gallium oxide substrate 11 is in contact with nitrogen supplied into the growth reactor 10, this contact prevents the gallium oxide substrate 11 from being affected by hydrogen. For this reason, the susceptor temperature can be made higher, as compared with the temperature at which when hydrogen is supplied into the growth reactor 10. In the nitrogen atmosphere, the substrate temperature for the gallium oxide substrate 11 can be, for example, 600 Celsius degrees.

After the temperature of the growth reactor 10 is increased to a growth temperature T1 in the nitrogen-containing atmosphere, in step S105, a Group III nitride buffer layer 13 is grown at the first temperature T1 on the primary surface 11a of the gallium oxide substrate 11. The buffer layer 13 comprises, for example, a Group III nitride such as GaN, AlGaN, or AlN. For growth of the Group III nitride, a source gas for this growth contains an organic gallium raw material, an organic aluminum raw material, a nitrogen raw material, and so on.

When the buffer layer 13 is comprised of GaN, the source gas G1 containing trimethylgallium (TMG) and ammonia (NH$_3$) is supplied into the growth reactor 10. In the case of the GaN layer buffer being used, reaction between GaN and hydrogen induces modification thereof to provide technical contribution by the modification. When the buffer layer 13 comprises AlGaN, the source gas G1 containing TMG, trimethylaluminum (TMA), and NH$_3$ is supplied into the growth reactor 10. When the AlGaN layer buffer is used, it is thermally stabler than a GaN buffer layer and therefore it provides technical contribution of allowing the use of a higher temperature than the second temperature. When the buffer layer 13 comprises AlN, the source gas G1 containing TMA and NH$_3$ is supplied into the growth reactor 10. When the AlN layer buffer is used, it is thermally stabler than the GaN buffer layer and therefore it provides technical contribution of allowing the use of a higher temperature than the second temperature T2. The growth temperature T1 of the buffer layer 13 is, for example, in the range of not less than 400 Celsius degrees and not more than 800 Celsius degrees and this buffer layer 13 is so called a low-temperature buffer layer.

The film thickness of the buffer layer 13 can be, for example, not less than 2 nanometers. When the thickness of the buffer layer is not less than 2 nanometers, more preferably not less than 10 nanometers, a Group III nitride semiconductor layer subsequently grown has excellent crystal quality. The thickness of the buffer layer can be not more than 100 nanometers. When the thickness of the buffer layer 13 is not more than 100 nanometers, the Group III nitride semiconductor layer has good crystal quality.

In step S106, after the growth of the buffer layer 13, the substrate temperature of the growth reactor 10 is changed to a second temperature T2 higher than the first temperature T1. After this step, in step S107, the gallium oxide substrate 11 and the buffer layer 13 ae exposed to the atmosphere in the growth reactor 11 at the substrate temperature of the second temperature T2, while supplying a gas G2 containing hydrogen and nitrogen into the growth reactor 10, as shown in FIG. 3 (c). The gas G2 can further contain ammonia. In exposing the gallium oxide substrate 11 and the buffer layer 13 to the atmosphere in the growth reactor 11, the atmosphere contains hydrogen and, more preferably, a flow rate of hydrogen is not less than a flow rate of nitrogen. The second temperature T2 is not less than 950 Celsius degrees, more preferably around 1050 Celsius degrees. When the flow rate of hydrogen is not less than the flow rate of nitrogen and the substrate temperature is not less than 950 Celsius degrees in the growth reactor 10, this allows the buffer layer 13 to turn into a modified buffer layer 14. The second temperature T2 is not more than 1200 Celsius degrees. Too much modification prevents a good epitaxial film from depositing thereon. This modification is implemented prior to growth of a Group III nitride semiconductor layer for gallium nitride based semiconductor optical device, and a Group III nitride semiconductor is grown on the modified buffer layer 14. When the thickness of the buffer layer 13 is smaller than the thickness of the Group III nitride semiconductor layer 15, the modification by the atmosphere containing hydrogen and nitrogen is induced in the buffer layer near the surface of the gallium oxide substrate 11.

A processing time for the exposure to the atmosphere can be not less than 10 seconds. When the time for the modification is not less than 10 seconds, more preferably not less than 1 minute, the aforementioned modification can be effectively induced.

After the gallium oxide substrate 11 and the buffer layer 14 are exposed to the atmosphere in the growth reactor 10, in step S108, the susceptor temperature of the growth reactor 10 is set to a third temperature T3, which is equal to or higher than the second temperature T2. After this step, in step S109, the Group III nitride semiconductor layer 15 for gallium nitride based semiconductor optical device is grown by the metal-organic vapor phase epitaxy, as shown in FIG. 4 (a). For example, when a Group III nitride such as GaN, AlGaN, InGaN, or AlN is formed on the buffer layer 14, this growth is epitaxially carried out on the gallium oxide substrate 11 to obtain the hexagonal Group III nitride semiconductor layer 15. When the Group III nitride semiconductor layer 15 is formed on the buffer layer 14, if deposition succeeding to the structure of the buffer layer 14 occurs in the initial stage of growth of the Group III nitride semiconductor layer 15, this initially growth layer, grown initially, and the buffer layer 14 together are called the modified layer 14 in some cases.

The Group III nitride semiconductor layer 15 can be comprised of GaN, InGaN, or AlGaN. When the Group III nitride semiconductor layer 15 is formed of any of these materials, good crystal quality is achieved on the modified buffer layer 14.

The film thickness of the Group III nitride semiconductor layer 15 can be, for example, in the range of not less than 1 micrometer and not more than 20 micrometers. The growth temperature T3 of the Group III nitride semiconductor layer 15 is, for example, in the range of not less than 950 Celsius degrees and not more than 1200 Celsius degrees. The Group III nitride semiconductor layer 15 is a semiconductor layer forming a gallium nitride based semiconductor device, which can be undoped, or doped with a p-type dopant or an n-type dopant. For imparting p-conductivity or n-conductivity to the epitaxial layer 15, a dopant gas is supplied in addition to the source gas in the growth of the Group III nitride semiconductor layer 15. The dopant can b e cyclopentadienyl magnesium ($Cp_2Mg$) for the p-type conductivity or silane (e.g., $SiH_4$) for the n-type conductivity. When the Group III nitride semiconductor layer 15 is comprised of n-type GaN, a source gas G3 containing TMG $NH_3$, and $SiH_4$ is supplied into the growth reactor 10. These steps result in forming a laminate body 16 on the gallium oxide substrate 11.

Next, step S110 is to supply a source gas G4 into the growth reactor 10 to form an active layer 17 on the Group III nitride semiconductor layer 15, as shown in FIG. 4 (b). When the active layer 17 has a quantum well structure, the active layer 17 includes well layers 17a and barrier layers 17b arranged alternately. The well layers 17a are comprised, for example, of GaN, InGaN, or InAlGaN. The growth temperature of the well layers 17a is, for example, 750 Celsius degrees. The barrier layers 17b are comprised, for example, of GaN, InGaN, or InAlGaN. The growth temperature of the barrier layers 17b is, for example, 750 Celsius degrees.

According to this method, the susceptor temperature is changed from the first temperature T1 for the growth of the buffer layer 13 to the second temperature T2, and then the gallium oxide substrate 11 and the buffer layer 13 are exposed to the atmosphere containing hydrogen and nitrogen at the substrate temperature of not less than 950 Celsius degrees, more preferably around 1050 Celsius degrees, to form the modified buffer layer 14. When the atmosphere is prepared to contain hydrogen and, more preferably, the flow rate of hydrogen is not less than the flow rate of nitrogen and the substrate temperature is not less than 950 Celsius degrees, much more preferably the substrate temperature of 1050 Celsius degrees, the buffer layer 14 undergoes sufficient modification. The growth of the Group III nitride semiconductor is carried out on the modified buffer layer 14.

After this, in step S111, a gallium nitride based semiconductor layer 19 is formed on the active layer 17, as shown in FIG. 4 (c). The gallium nitride based semiconductor layer 19 can contain, for example, a p-type electron block layer 21 and a p-type contact layer 23.

The growth of gallium nitride based semiconductors up to the above results in obtaining a wafer product E, as shown in FIG. 5 (a). The wafer product E includes the gallium oxide wafer 11, and a semiconductor lamination 25 grown on the gallium oxide wafer 11. This semiconductor lamination 25 includes the Group III nitride semiconductor layer 15 (e.g., a first conductivity type epitaxial layer), the active layer 17, and the gallium nitride based semiconductor layer 19 (e.g., a second conductivity type epitaxial layer), and the active layer 17 is provided between the first conductivity type epitaxial layer and the second conductivity type epitaxial layer. The gallium oxide substrate 11, Group III nitride semiconductor layer 15, active layer 17, and gallium nitride based semiconductor layer 19 constitute the wafer product. In the subsequent step, a first electrode which provides a potential to the Group III nitride semiconductor layer 15 is formed on the wafer product E, and a second electrode that provides a potential to the gallium nitride based semiconductor layer 19 is formed on the wafer product E. Carriers which are injected into the active layer 17 are supplied from the first and second electrodes. The carriers migrate through the conductive gallium oxide substrate 11 to reach the active layer 17.

The following steps in the flow are carried out as an example of steps of the electrode process. In step S112, the wafer product E is etched to form a semiconductor mesa 27, as shown in FIG. 5 (b). A part of the semiconductor lamination 25 is removed by this etching to expose a part of the Group III nitride semiconductor layer 15 in the semiconductor lamination 25 and form a top surface 27d of the semiconductor mesa 27 (surface 19d of the gallium nitride based semiconductor layer 19c).

After this processing of the wafer product E, in step S113, the first electrode 29a is formed on the exposed part 15d of the Group III nitride semiconductor layer 15 and the second electrode 29b is formed on the top surface 27d of the semiconductor mesa 27, as shown in FIG. 5 (c). These steps result in fabricating a substrate product for gallium nitride based semiconductor light emitting device.

As seen from the description of examples below, the modified buffer layer 14 has the structure that with be described below. When the active layer 17 is grown after the modification step, the emission intensity in the active layer 17 can be improved thereby.

The laminate body 16 can include plural voids formed at the interface between the gallium oxide substrate 11 and the laminate body 16. The modification process forms the plural voids at the interface. The laminate body 16 includes a transition layer, which is formed at the interface between the gallium oxide substrate 11 and the laminate body 16, and the transition layer covers the primary surface 11a of the gallium oxide substrate 11. The modification process forms the transition layer at the foregoing interface. The transition layer can include a Group III nitride region.

Example 1

Experimental Example 1

With Neither Voids Nor Transition Layer at Interface of Gallium Oxide Substrate/Epitaxial Layer A (100)-plane gallium oxide substrate is prepared as below. The primary surface of the gallium oxide substrate is intentionally provided with no off angle. An AlN buffer layer is grown on the (100) just plane of the gallium oxide substrate by MOVPE. The growth temperature of this AlN is 600 Celsius degrees. The thickness of the AlN layer is 10 nanometers. The temperature is increased from 600 Celsius degrees to 1050 Celsius degrees in four minutes. During this temperature rise, the flow rate of hydrogen ($H_2$) is 5 l/min, the flow rate of ammonia ($NH_3$) 5 l/min, and the flow rate of nitrogen ($N_2$) 10 l/min. After this, a GaN epitaxial layer is grown on this AlN layer by the MOVPE method. The thickness of this GaN layer is 3 micrometers. These steps result in obtaining an epitaxial substrate EW1.

Figure 6:
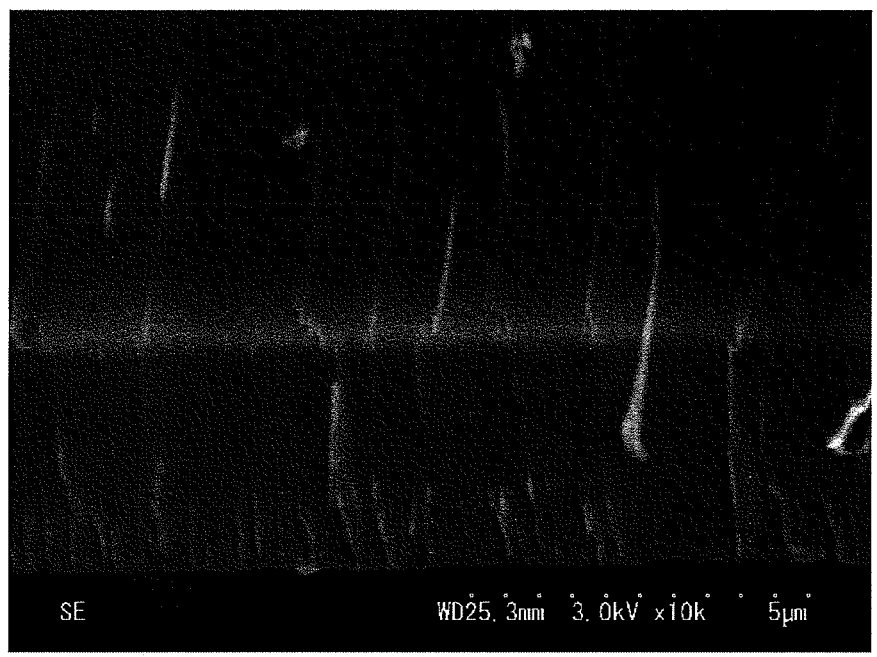
FIG. 6 is a drawing showing an SEM image in Example 1.

For reference, a GaN layer is grown through a low-temperature GaN buffer layer on a sapphire substrate. An epitaxial substrate EW0 is obtained through these steps. FIG. 6 is a drawing showing a cross-sectional SEM image of the sapphire substrate, AlN buffer layer, and GaN epitaxial layer. The quality level as to the full width at half maximum of XRC and the surface roughness with an atomic force microscope of the GaN layer is equivalent to the quality level in the reference example on the sapphire substrate.

When the epitaxial substrate EW0 is compared with the epitaxial substrate EW1, neither voids nor transition layer is observed at the interface, e.g., about the interface of epitaxial layer/gallium oxide substrate, in the present example as in the reference example on the sapphire substrate.

Experimental Example 2

With Small Voids Formed at Interface of Gallium Oxide Substrate/Epitaxial Layer

A (100)-plane gallium oxide substrate is prepared as below. The primary surface of the gallium oxide substrate is intentionally provided with no off angle. An AlN buffer layer is grown on the (100) just plane of the gallium oxide substrate by MOVPE. The growth temperature of this AlN is 600 Celsius degrees. The thickness of the AlN layer is 10 nanometers. The temperature was increased from 600 Celsius degrees to 950 Celsius degrees in four minutes. During this temperature rise, the flow rate of hydrogen ($H_2$) is 10 l/min, the flow rate of ammonia ($NH_3$) 5 l/min, and the flow rate of nitrogen ($N_2$) 5 l/min. After this process, prior to growth of a GaN epitaxial layer, the AlN buffer layer is held at 950 Celsius degrees in a mixture atmosphere of hydrogen and nitrogen for one minute to perform the modification process. Thereafter, a GaN epitaxial layer was grown on the modified buffer layer by the MOVPE process. The thickness of this GaN layer was 3 micrometers. An epitaxial substrate EW2 is obtained through these steps. The quality level as to the full width at half maximum of XRC and the surface roughness with the atomic force microscope of the GaN layer is equivalent to the quality level in the reference example on the sapphire substrate.

Figure 7:
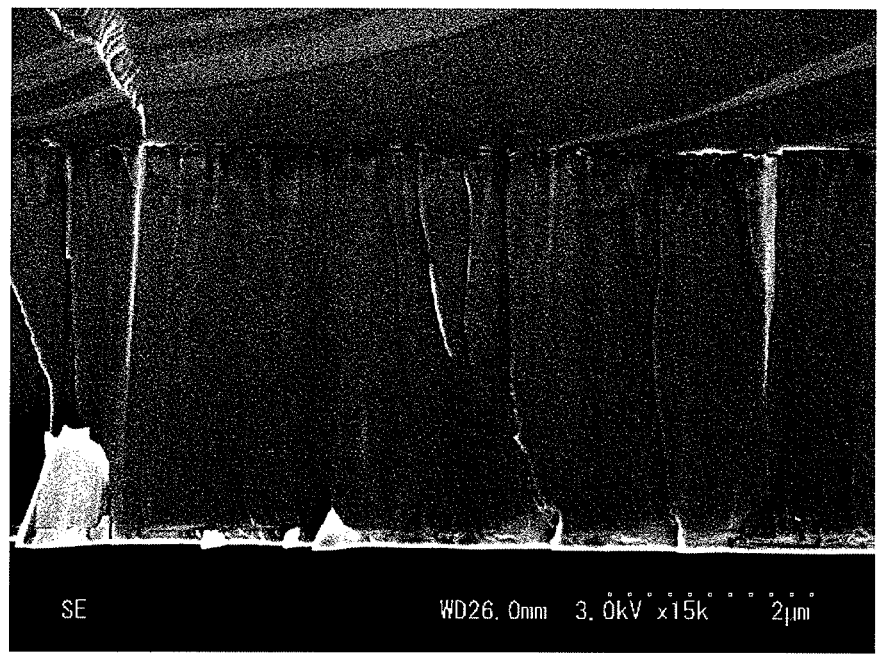
FIG. 7 is a drawing showing an SEM image in Example 1.

FIG. 7 is a drawing showing a cross-sectional SEM image of the gallium oxide substrate, AlN buffer layer, and GaN epitaxial layer in Experimental Example 2. In the present example, voids in the size (width) of about 100 nm are observed at the interface, which is different from the reference example on the sapphire substrate. The size of voids could be changed in the range of about 10 nm to 1 μm, depending upon growth conditions such as the temperature and the ratio of hydrogen.

The present experimental example uses the AlN buffer layer, but such a transition layer can be produced at the interface, according to the film formation conditions of low-temperature grown GaN and low-temperature grown AlGaN and a thermal treatment after film formation of the buffer layer.

Experimental Example 3

With Large Voids Formed at Interface of Gallium Oxide Substrate/Epitaxial Layer

A (100)-plane gallium oxide substrate is prepared as below. The primary surface of the gallium oxide substrate is intentionally provided with no off angle. An AlN buffer layer is grown on the (100) just plane of the gallium oxide substrate by the MOVPE process. The growth temperature of this AlN is 600 Celsius degrees. The thickness of the AlN layer is 10 nanometers. The temperature is increased from 600 Celsius degrees to 1050 Celsius degrees for four minutes. During this temperature increase, the flow rate of hydrogen ($H_2$) is 10 l/min, the flow rate of ammonia ($NH_3$) 5 l/min, and the flow rate of nitrogen ($N_2$) 5 l/min. After this temperature change, prior to growth of a GaN epitaxial layer, the AlN buffer layer is kept at 1050 Celsius degrees in the mixture atmosphere of hydrogen and nitrogen for one minute to perform the modification. Thereafter, a GaN epitaxial layer is grown on the modified buffer layer by MOVPE. The thickness of this GaN layer is 3 micrometers. An epitaxial substrate EW3 is obtained through these steps. The quality level as to the full width at half maximum of XRC and the surface roughness with the atomic force microscope of the GaN layer is equivalent to the quality level in the reference example on the sapphire substrate.

Figure 8:
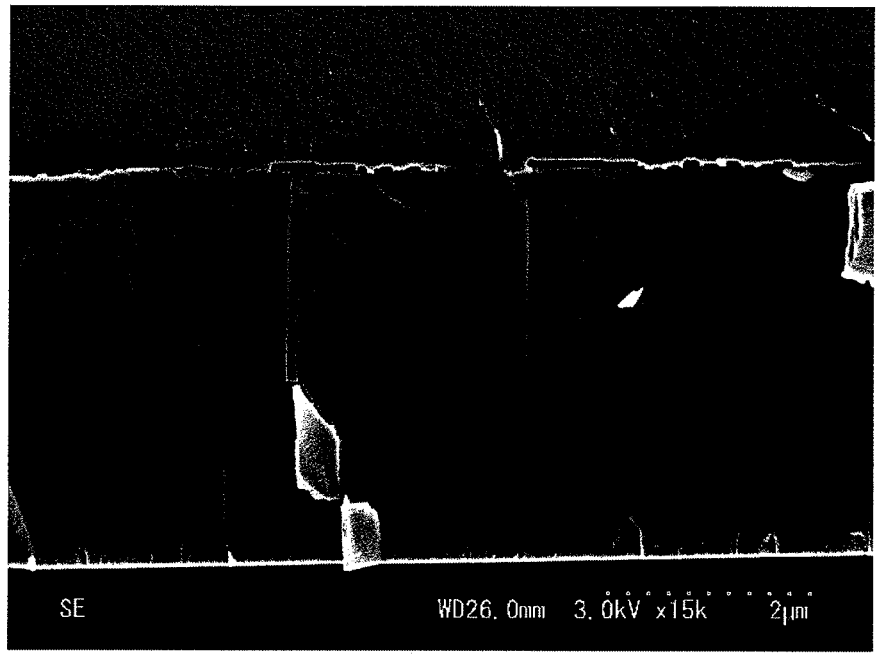
FIG. 8 is a drawing showing an SEM image in Example 1.

FIG. 8 is a drawing showing a cross-sectional SEM image of the gallium oxide substrate, AlN buffer layer, and GaN epitaxial layer in Experimental Example 3. In the present example, unlikely to the reference example on the sapphire substrate, voids in the size (width) of about 100 nm are observed at the interface. The size of voids could be changed in the range of about 10 nm to 1 μm and even to greater size, depending upon the growth conditions such as the temperature and the ratio of hydrogen.

The present experimental example employed the AlN buffer layer, but it is also possible to produce such voids at the interface, by use of the film formation conditions of low-temperature grown GaN and low-temperature grown AlGaN and the thermal treatment after the film formation of the buffer layer.

Experimental Example 4

With Transition Layer Formed at Interface of Gallium Oxide Substrate/Epitaxial Layer A (100)-plane gallium oxide substrate is prepared. The primary surface of the gallium oxide substrate is intentionally provided with no off angle. A GaN buffer layer is grown on the (100) just plane of the gallium oxide substrate by the MOVPE process. The growth temperature of this GaN is 500 Celsius degrees. The thickness of the GaN layer is 25 nanometers. The temperature is increased from 600 Celsius degrees to 1050 Celsius degrees for four minutes. During this temperature increase, the flow rate of hydrogen ($H_2$) is 10 l/min, the flow rate of ammonia ($NH_3$) 5 l/min, and the flow rate of nitrogen ($N_2$) 5 l/min. After the temperature change, prior to growth of a GaN epitaxial layer, the GaN buffer layer is kept at 1050 Celsius degrees in the mixture atmosphere of hydrogen and nitrogen for one minute to perform a thermal treatment. Thereafter, a GaN epitaxial layer is grown on the thermally treated buffer layer by MOVPE. The thickness of this GaN layer is 3 micrometers. An epitaxial substrate EW4 is obtained through these steps. The quality level as to the full width at half maximum of XRC and the surface roughness with the atomic force microscope of the GaN layer was equivalent to the quality level in the reference example on the sapphire substrate.

Figure 9:
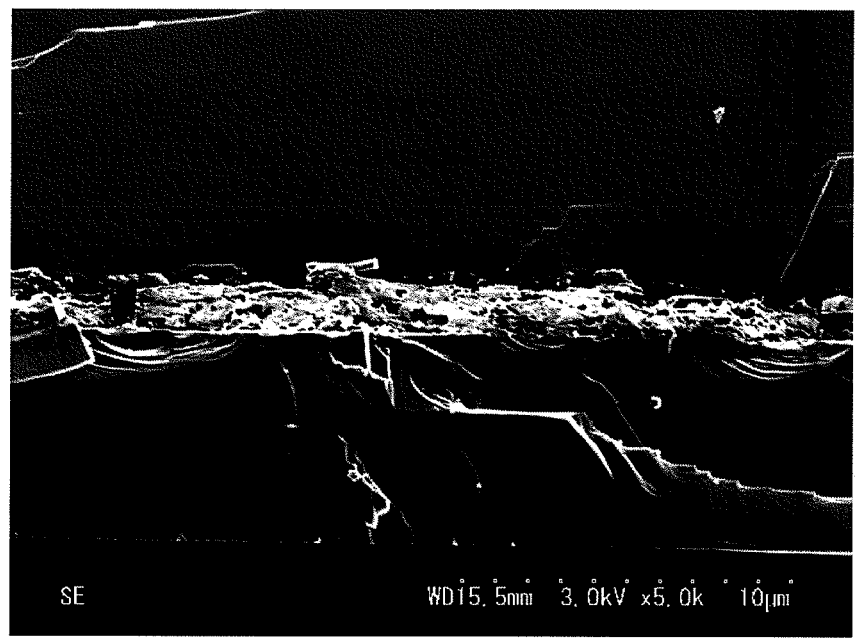
FIG. 9 is a drawing showing an SEM image in Example 1.

FIG. 9 is a drawing showing a cross-sectional SEM image of the gallium oxide substrate, GaN buffer layer, and GaN epitaxial layer in Experimental Example 4. In the present example, different from the reference example on the sapphire substrate, the transition layer in the thickness of about 2 μm is observed at the interface. This transition layer is composed of Ga, N, and O, and can be a layer comprising a mixture of GaN, $Ga_2O_3$, and so on. The transition layer can include, for example, a porous Group III nitride region.

The present experimental example uses the GaN buffer layer, but it is also possible to produce such a transition layer at the interface, according to the film formation conditions of low-temperature grown AlN and low-temperature grown AlGaN and the thermal treatment after the film formation of the buffer layer.

Example 2

Figure 10:
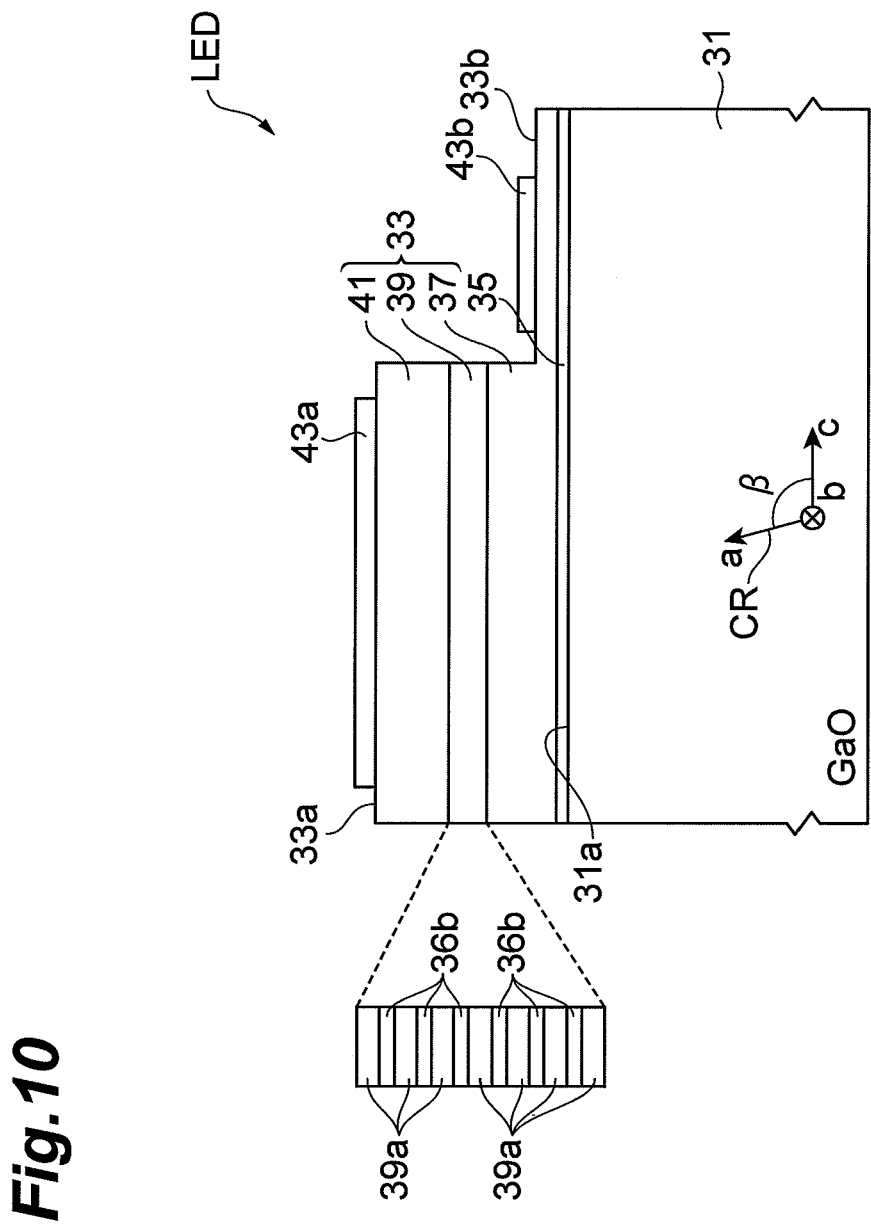
FIG. 10 is a drawing showing a structure of a light emitting diode in Example 2.

Epitaxial structures for light emitting diode (LED) are formed using the respective epitaxial substrates EW0 to EW4 produced in Example 1. FIG. 10 shows the epitaxial structure in Example 2. The light emitting diode structure LED includes a modified layer 35, an n-type GaN layer 37, an active layer 39, and a p-type GaN layer 41. In the light emitting diode LED, the modified layer 35, n-type GaN layer 37, active layer 39, and p-type GaN semiconductor layer 41 are provided on a primary surface 31a of gallium oxide substrate 31, and the p-type GaN semiconductor layer 41 includes a p-type AlGaN block layer and a p-type GaN contact layer. The light emitting diode structure LED includes a semiconductor mesa 33 formed by etching. The p-type GaN contact layer is exposed in a top surface 33a of the semiconductor mesa 33. The semiconductor mesa 33 includes the exposed n-type GaN layer 37. The n-type GaN layer 37 includes an exposed region 33b. A p-side electrode 43a is formed on the top surface 33a. An n-side electrode 43b is formed on the exposed region 33b. Through these steps, the light emitting diode structures LED0 to LED4 are obtained using the respective epitaxial substrates EW0 to EW4. Each of the light emitting diode structures LED0 to LED4 is placed on a prover and an electric current of 20 mA is applied to the light emitting diode structures LED0-LED4, thereby measuring the emission intensity thereof. In the light emitting diode structures LED1 to LED4, in order to reduce increase of electrical resistance due to the thickness of the buffer layer, the thickness of the buffer layer can be not more than 100 nanometers, more preferably not more than 30 nanometers.

FIG. 11 is a drawing showing the emission intensities of the light emitting diode structures LED0 to LED4. The emission intensities of the light emitting diode structures LED 1, LED2, LED3, and LED4 are 1.2 times, 1.3 times, 1.5 times, and 1.4 times that of the light emitting diode structure LED0 as reference.

Figure 12:
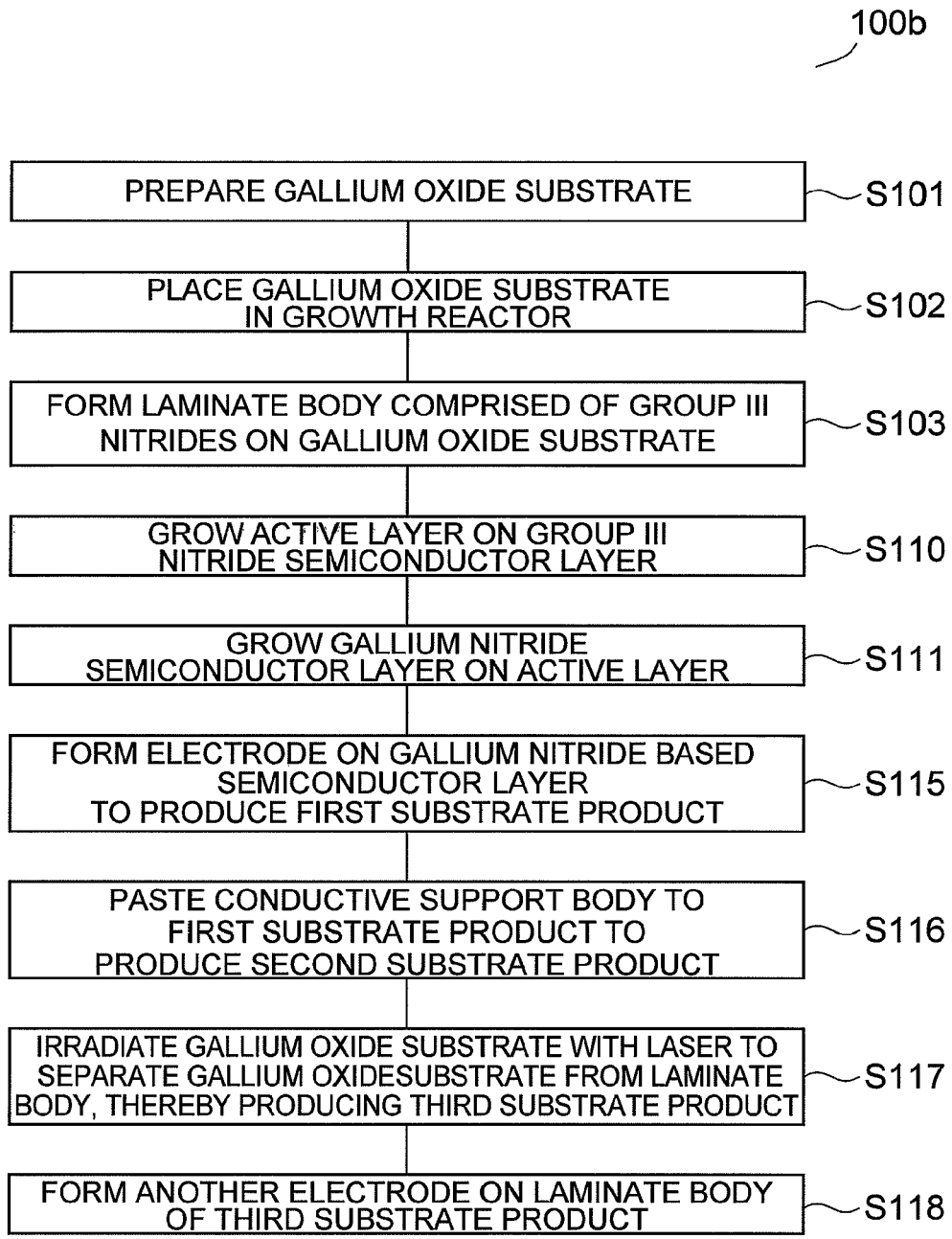
FIG. 12 is a drawing showing the major steps flow in a method for fabricating a wafer product and a method for fabricating a gallium nitride based semiconductor optical device according to another embodiment.

FIG. 12 is a drawing showing a flow with major steps in a method for fabricating a wafer product and a method for fabricating a gallium nitride based semiconductor optical device according to another embodiment. In the step flow 100b, in step S101a gallium oxide substrate 11 with a primary surface is prepared and the primary surface comprises monoclinic gallium oxide. Steps S101 to S103 and S110 to S111 are carried out in the same manner as in the step flow 100a shown in FIG. 1.

Figure 13:
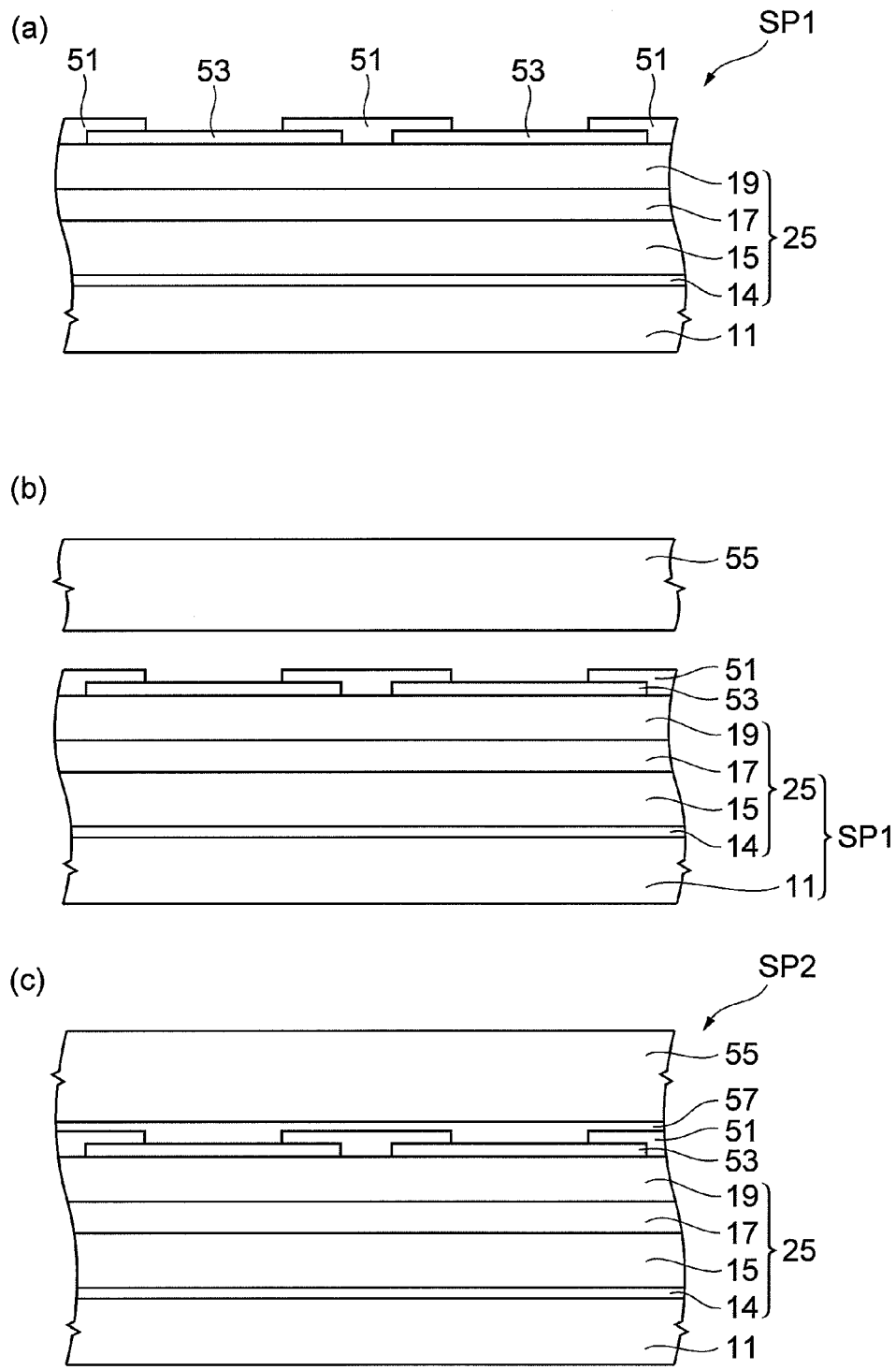
FIG. 13 is a drawing schematically showing major steps in the method for fabricating the wafer product and the method for fabricating the gallium nitride based semiconductor optical device according to the other embodiment.

In step S115 is to form an electrode 51 on the gallium nitride based semiconductor layer 19 to produce a substrate product SP1, as shown in FIG. 13 (a). The formation of the electrode 51 is carried out, for example, as follows. An insulating film 53 is formed on the surface of the gallium nitride based semiconductor layer 19. An aperture is formed in the insulating film 53 and the insulating film 53 can comprise, for example, silicon oxide or silicon nitride.

In step S116, an electro-conductive support body 55 for bonding is prepared, as shown in FIG. 13 (b). This substrate 55 comprises, for example, a Si substrate, a heat sink, or the like. As shown in FIG. 13 (b), the substrate product SP1 and the substrate 55 are arranged so that the electrode 51 on the substrate product SP1 faces the electro-conductive support body 55.

Next, the electro-conductive support body 55 is bonded to the substrate product SP1 to produce a substrate product SP2. In the substrate product SP2, the electro-conductive support body 55 makes electrical connection to the electrode 53. This bonding is carried out, for example, using an electro-conductive adhesive 57 or the like, as shown in FIG. 13 (c). The electro-conductive adhesive 57 can be, for example, a solder such as AuSn or PbSn.

Figure 14:
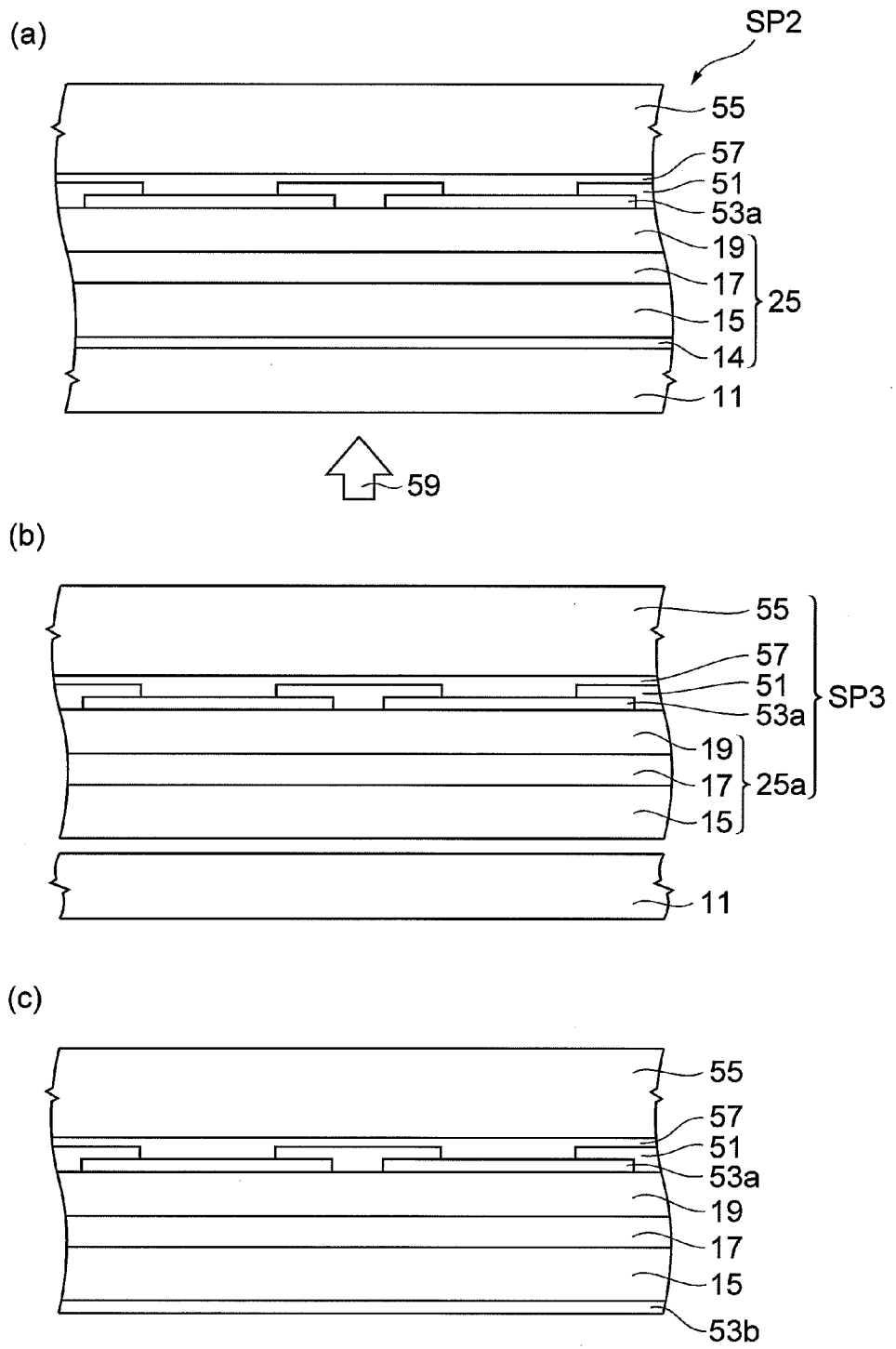
FIG. 14 is a drawing schematically showing major steps in the method for fabricating the wafer product and the method for fabricating the gallium nitride based semiconductor optical device according to the other embodiment.

In step 117, the gallium oxide substrate 11 of the substrate product SP2 is irradiated with a laser beam 59, as shown in FIG. 14 (a). The wavelength of the laser beam 59 is shorter than the wavelength corresponding to the bandgap of the gallium oxide substrate 11 and longer than the wavelength corresponding to the bandgap of the Group III nitride semiconductor layer 15. The laser beam is provided, for example, by excimer laser. This irradiation separates the gallium oxide substrate 11 from the semiconductor lamination 25a of the substrate product SP2, as shown in FIG. 14 (b), to produce a substrate product SP3 which includes the semiconductor lamination 25a and the electroconductive support body 55. When the gallium oxide substrate 11 is irradiated with the laser beam 59, the modified layer 14 facilitates liftoff. This separation results in exposing the Group III nitride semiconductor layer 15. Roughness remains in the surface of the Group III nitride semiconductor layer 15 of the semiconductor lamination 25a exposed by liftoff.

In step S118, an electrode 53b is formed on the surface of the Group III nitride semiconductor layer 15, as shown in FIG. 14 (c).

Example 3

An experiment is conducted to investigate the substrate separation using the laser beam. The back surface of the gallium oxide substrate is irradiated with an excimer laser beam to peel the epitaxial film off from the gallium oxide substrate. The experiment of peeling starts with forming pieces for experiment with the size of 10 mm×10 mm out of each wafer product by cutting. The experiment pieces are irradiated with the laser and irradiation time necessary for separation is measured. FIG. 15 is a drawing showing relative values of the time for separation. With reference to FIG. 13, the time for peeling are shown as relative values of 0.36, 0.38, 0.17, and 0.08. Since gallium oxide ($Ga_2O_3$) is weaker in chemical bond than sapphire ($Al_2O_3$) as proved above, the relative value thereof is 0.36 and the peeling with the laser is easier. In addition thereto, when voids are formed at the interface of gallium oxide substrate/epitaxial film, their relative values become 0.28 and 0.17 according to the sizes of voids. When the transition layer is formed at the interface of gallium oxide substrate/epitaxial film, the relative value becomes 0.08 according to the density of the transition layer. Since the voids or the transition layer is formed at the interface of gallium oxide substrate/epitaxial film, the time necessary for peeling by the laser liftoff becomes shorter.

The principle of the present invention has been illustrated and described in the preferred embodiments, and it is recognized by those skilled in the art that the present invention can be modified in arrangement and details without departing from the principle. The present invention is by no means limited to the specific configurations disclosed in the embodiments. Therefore, we claims all modifications and changes falling within the scope of claims and resulting from the scope of spirit thereof.

INDUSTRIAL APPLICABILITY

There are attempts to improve the light extraction efficiency of the light emitting diode and thereby increase the emission efficiency of the light emitting diode. In Non Patent Literature 2, the sapphire substrate is roughened to improve the light extraction efficiency. In Non Patent Literature 3, the light extraction efficiency is improved by roughening the back surface of the epitaxial film along with the substrate peeling.

When a GaN film is epitaxially grown on a sapphire substrate, epitaxial growth of GaN is carried out onto a low-temperature AlN buffer layer or onto a low-temperature GaN buffer layer. At this time, voids or the like are not formed at the interface of GaN epitaxial film/sapphire substrate. On the other hand, when a GaN film is epitaxially grown on a gallium oxide substrate, voids or the like can be formed at the interface of GaN epitaxial film/gallium oxide substrate by devising the growth method. Some modification conditions also allow formation of a modified layer and roughness, as well as the voids.

When the light extraction efficiency is improved by processing the sapphire substrate so as to cause scattering at the interface of epitaxial film/sapphire substrate, it becomes necessary to perform additional microprocessing of the sapphire substrate. As understood from this example, it is not easy to peel the GaN epitaxial film off from the sapphire substrate and it is necessary to use an expensive apparatus such as the excimer laser for a long period of time. Furthermore, it also becomes necessary to carry out the step of roughening the epitaxial film surface exposed by peeling.

When the GaN epitaxial film is grown on the gallium oxide substrate, some growth conditions allow formation of roughness, voids, or the like at the interface of epitaxial film/gallium oxide substrate. This modification of interface is provided, for example, by an atmosphere such as the temperature increase ambiance (high hydrogen partial pressure or low nitrogen partial pressure) and/or an anneal treatment at a high temperature close to the film formation temperature of GaN. Furthermore, by lengthening the anneal period of time, it becomes feasible to roughen the interface of epitaxial film/gallium oxide substrate to form roughness and also to form voids or a modified layer. Without need for use of the processed sapphire substrate or the like, the light extraction efficiency is enhanced by modification of the region near the interface of epitaxial film/gallium oxide substrate. As a result, it becomes feasible to improve the emission efficiency of the light emitting diode.

By forming the large voids, the transition layer at the interface, the roughness, or the like, the peeling occurs readily and at the same time, formation of roughness in the back surface of the epitaxial film is substantialized in epitaxial growth. Accordingly, it becomes possible to omit the process for formation of roughness in the back surface of the epitaxial film. The light extraction efficiency is improved by adopting this method, and easiness of substrate separation, high yield, etc. are provided. In this method, the gallium oxide substrate is etched with high-temperature hydrogen gas, using nuclei of GaN as a mask in the initial stage of growth of the GaN epitaxial film.

Since gallium oxide has weak bonds between gallium and oxide, it is damaged by a high-temperature atmosphere, particularly, hydrogen or the like. Hence, it is important to avoid undesired damage to the gallium oxide substrate during the temperature increase after deposition of the buffer layer.

LIST OF REFERENCE SIGNS

10 . . . growth reactor;
10a . . . susceptor;
11 . . . gallium oxide substrate;
11a . . . primary surface of substrate;
11b . . . back surface of substrate;
13 . . . Group III nitride buffer layer;
14 . . . buffer layer, or modified layer;
15 . . . Group III nitride semiconductor layer;
16 . . . laminate body;
17 . . . active layer;
19 . . . gallium nitride based semiconductor layer;
21 . . . p-type electron block layer;
23 . . . p-type contact layer;
E . . . wafer product;
25, 25a . . . semiconductor lamination;
27 . . . semiconductor mesa;
29a, 29b . . . electrode.

The invention claimed is:

1. A method for fabricating a wafer product for a gallium nitride based semiconductor optical device, comprising the steps of:
   preparing a gallium ($Ga_2O_3$) substrate;
   forming a laminate body on a primary surface of the gallium oxide substrate, the laminate body comprising Group III nitrides;
   forming an active layer, after forming the laminate body; and
   growing a gallium nitride based semiconductor layer on the active layer,
   forming the laminate body comprises:
   placing the gallium oxide substrate in a growth reactor and thereafter growing a Group III nitride buffer layer at a first temperature on the primary surface of the gallium oxide substrate;
   changing a substrate temperature from the first temperature to a second temperature higher than the first temperature, after growing the Group III nitride buffer layer;
   exposing the gallium oxide substrate and the Group III nitride buffer layer to an atmosphere in the growth reactor at the substrate temperature of the second temperature, while supplying hydrogen and nitrogen into the growth reactor; and
   depositing a Group III nitride semiconductor layer for the gallium nitride based semiconductor optical device by a metal-organic vapor phase epitaxy method, after exposing the gallium oxide substrate and the Group III nitride buffer layer to the atmosphere in the growth reactor,
   the Group III nitride semiconductor layer having a first conductivity type,
   the gallium nitride based semiconductor layer having a second conductivity type, and a thickness of the Group III nitride buffer layer being smaller than a thickness of the Group III nitride semiconductor layer.

2. The method according to claim 1, wherein the second temperature is not less than 950 Celsius degrees.

3. The method according to claim 1, wherein in exposing the gallium oxide substrate and the Group III nitride buffer layer to the atmosphere in the growth reactor, a flow rate of hydrogen is not less than a flow rate of nitrogen.

4. The method according to claim 1, wherein a processing time in exposing to the atmosphere is not less than 10 seconds.

5. The method according claim 1, wherein a thickness of the Group III nitride buffer layer is not less than 2 nanometers.

6. The method according to claim 1, wherein the Group III nitride buffer layer includes at least one of a GaN layer, an AlGaN layer, and an AlN layer.

7. The method according to claim 1, wherein the Group III nitride buffer layer includes a GaN layer.

8. The method according to claim 1, wherein the Group III nitride semiconductor layer comprises GaN and AlGaN.

9. The method according to claim 1, wherein the primary surface of the gallium oxide substrate is a (100) plane.

10. The method according to claim 1, wherein the laminate body includes plural voids formed at an interface between the gallium oxide substrate and the laminate body.

11. The method according to claim 1, wherein the laminate body includes a transition layer located at an interface between the gallium oxide substrate and the laminate body, and
wherein the transition layer covers the primary surface of the gallium oxide substrate.

12. A method for fabricating a gallium nitride based semiconductor optical device, comprising the steps of:
preparing a gallium ($Ga_2O_3$) substrate;
forming a laminate body on a primary surface of the gallium oxide substrate, the laminate body comprising Group III nitrides;
forming an active layer, after forming the laminate body; and
growing a gallium nitride based semiconductor layer on the active layer,
the step of forming the laminate body comprising:
placing the gallium oxide substrate in a growth reactor and thereafter growing a Group III nitride buffer layer at a first temperature on the primary surface of the gallium oxide substrate;
changing a substrate temperature from the first temperature to a second temperature after growing the Group III nitride buffer layer, the second temperature being higher than the first temperature;
exposing the gallium oxide substrate and the Group III nitride buffer layer to an atmosphere in the growth reactor at the substrate temperature of the second temperature, while supplying hydrogen and nitrogen into the growth reactor; and
depositing a Group III nitride semiconductor layer for the gallium nitride based semiconductor optical device by a metal-organic vapor phase epitaxy method, after exposing the gallium oxide substrate and the Group III nitride buffer layer to the atmosphere in the growth reactor,
the Group III nitride semiconductor layer having a first conductivity type,
the gallium nitride based semiconductor layer having a second conductivity type, and
a thickness of the Group III nitride buffer layer being smaller than a thickness of the Group III nitride semiconductor layer.

13. The method according to claim 12, wherein the second temperature is not less than 950 Celsius degrees.

14. The method according to claim 12, wherein in exposing the gallium oxide substrate and the Group III nitride buffer layer to the atmosphere in the growth reactor, a flow rate of hydrogen is not less than a flow rate of nitrogen.

15. The method according to claim 12, wherein a processing time in the step of exposing to the atmosphere is not less than 10 seconds.

16. The method according to claim 12, wherein the thickness of the Group III nitride buffer layer is not less than 2 nanometers.

17. The method according to claim 12, wherein the primary surface of the gallium oxide substrate is a (100) plane.

18. The method according to claim 12, wherein the Group III nitride buffer layer includes at least one of a GaN layer, an AlGaN layer, and an AlN layer.

19. The method according to claim 12, wherein the Group III nitride semiconductor layer comprises GaN and AlGaN.

20. The method according to claim 12, wherein the laminate body includes a modified layer located at an interface between the gallium oxide substrate and the laminate body,
wherein the modified layer is made by exposing the gallium oxide substrate and the Group III nitride buffer layer to an atmosphere containing hydrogen and nitrogen in the growth reactor, and
wherein the modified layer includes plural voids located at an interface between the gallium oxide substrate and the laminate body.

21. The method according to claim 12, wherein the laminate body includes a modified layer located at an interface between the gallium oxide substrate and the laminate body,
wherein the modified layer is made by exposing the gallium oxide substrate and the Group III nitride buffer layer to an atmosphere containing hydrogen and nitrogen in the growth reactor, and
wherein the modified layer has a transition layer covering the primary surface of the gallium oxide substrate.

22. The method according to claim 12, wherein the gallium oxide substrate, the Group III nitride semiconductor layer, the active layer, and the gallium nitride based semiconductor layer constitute a wafer product,
the method further comprising:
forming a first electrode on the wafer product, the first electrode being provided to provide a potential to the Group III nitride semiconductor layer; and
forming a second electrode on the wafer product, the second electrode being provided to provide a potential to the gallium nitride based semiconductor layer.

23. The method according to claim 22, wherein the thickness of the Group III nitride buffer layer is not more than 100 nanometers.

24. The method according to claim 12, further comprising the steps of:
etching the active layer and the gallium nitride based semiconductor layer to expose the Group III nitride semiconductor layer;
forming a first electrode on the wafer product, the first electrode being provided to provide a potential to the Group III nitride semiconductor layer; and
forming a second electrode on the wafer product, the second electrode being provided to provide a potential to the gallium nitride based semiconductor layer.

* * * * *